(12) United States Patent
Ford et al.

(10) Patent No.: US 7,161,809 B2
(45) Date of Patent: *Jan. 9, 2007

(54) INTEGRAL HEAT SPREADER

(75) Inventors: Brian M. Ford, Grayslake, IL (US);
Gary D. Shives, Brunswick, OH (US);
Julian Norley, Chagrin Falls, OH (US);
Robert Anderson Reynolds, III, Bay Village, OH (US)

(73) Assignee: Advanced Energy Technology Inc., Lakewood, OH (US)

( * ) Notice: Subject to any disclaimer, the term of this patent is extended or adjusted under 35 U.S.C. 154(b) by 169 days.

This patent is subject to a terminal disclaimer.

(21) Appl. No.: 10/941,639

(22) Filed: Sep. 15, 2004

(65) Prior Publication Data

US 2006/0056157 A1    Mar. 16, 2006

(51) Int. Cl.
*H05K 7/20* (2006.01)

(52) U.S. Cl. ............ 361/719; 361/704; 361/707; 361/708; 165/185

(58) Field of Classification Search ............ 361/704, 361/707, 719; 257/706; 165/80.3, 185; 174/16.1; 428/408
See application file for complete search history.

(56) References Cited

U.S. PATENT DOCUMENTS

| | | | |
|---|---|---|---|
| 3,404,061 A | 10/1968 | Shane et al. ............ 161/125 |
| 4,530,949 A * | 7/1985 | Atkinson et al. ............ 523/512 |
| 4,878,152 A * | 10/1989 | Sauzade et al. ............ 361/721 |
| 4,895,713 A | 1/1990 | Greinke et al. ............ 423/448 |
| 5,195,021 A * | 3/1993 | Ozmat et al. ............ 361/720 |
| 5,991,155 A | 11/1999 | Kobayashi et al. ......... 361/705 |
| 6,075,701 A * | 6/2000 | Ali et al. ............ 361/704 |
| 6,090,484 A * | 7/2000 | Bergerson ............ 428/355 EN |
| 6,245,400 B1 | 6/2001 | Tzeng et al. ............ 428/40.1 |
| 6,257,329 B1 * | 7/2001 | Balzano ............ 165/185 |
| 6,482,520 B1 | 11/2002 | Tzeng ............ 428/408 |
| 6,503,626 B1 | 1/2003 | Norley et al. ............ 428/408 |
| 6,538,892 B1 | 3/2003 | Smalc ............ 361/710 |
| 6,652,958 B1 * | 11/2003 | Tobita ............ 428/298.1 |
| 6,777,086 B1 * | 8/2004 | Norley et al. ............ 428/408 |
| 2002/0163076 A1 * | 11/2002 | Tzeng et al. ............ 257/720 |
| 2002/0166660 A1 * | 11/2002 | Norley et al. ............ 165/905 |
| 2003/0067733 A1 * | 4/2003 | Mercuri et al. ............ 361/220 |

* cited by examiner

*Primary Examiner*—Boris Chérvinsky
(74) *Attorney, Agent, or Firm*—Waddey & Patterson; James R. Cartiglia (57) ABSTRACT

A thermal solution for equipment containing a heat-generating component, which is positioned between the heat-generating component and an external surface of the equipment, where the thermal solution facilitates heat dissipation from the heat-generating component while shielding the external surface from the heat generated by the heat-generating component.

13 Claims, 3 Drawing Sheets

INTEGRAL HEAT SPREADER

Be it known that we, Brian M. Ford, a citizen of the United States of America, residing at 421 Harvey Avenue, Grayslake, Ill.; Gary D. Shives, a citizen of the United States of America, residing at 2900 Elmer Drive, Brunswick, Ohio; Julian Norley, a citizen of the United States, residing at 17635 Plum Creek Trail, Chagrin Falls, Ohio 44023; and Robert Anderson Reynolds, III, a citizen of the United States of America, residing at 499 Oakmoor Road, Bay Village, Ohio, have invented a new and useful invention entitled "INTERGRAL HEAT SPREADER."

TECHNICAL FIELD

The present invention relates to a thermal solution capable of reducing hot spots on the external surfaces of equipment containing heat generating components, such as components of an electronic device, so as to mediate the effects of the heat on users of the equipment, and to dissipate the heat generated by the components.

BACKGROUND OF THE INVENTION

With the development of more and more sophisticated electronic devices, including those capable of increasing processing speeds and higher frequencies, having smaller size and more complicated power requirements, and exhibiting other technological advances, such as microprocessors and integrated circuits in electronic and electrical components like laptop computers, cell phones, personal digital assistants (PDAs), digital cameras and the like; high capacity and response memory components such as hard drives; electromagnetic sources such as light bulbs in digital projectors, as well as in other devices such as high power optical devices, relatively extreme temperatures can be generated. Indeed, electronics located in the dashboard of vehicles, and the like, can also be the source of high temperatures.

With the increase in heat generation in such devices over the recent past, hot spots, that is, localized high temperature areas, have become an issue. For instance, the increasing desire for smaller and more compact electronics, such as laptop computers, cell phones, PDAs, digital cameras and projectors, etc., means that the heat source (such as a hard drive, central processing unit (CPU), graphics chip, inverter/converter, memory chips, light sources, and the like) will be adjacent external surfaces of the device (even the dashboard of a vehicle). As such, external surfaces of the device can become heated, which can be uncomfortable or even dangerous to the user.

For instance, in some laptop computers, the hard drive, which can generate substantial amounts of heat, is located beneath one of the so-called "palm rests" of the computer—the area between the keyboard and the user, where the users palm is normally resting while typing. In thinner laptops, the heat generated by the hard drive can be transferred through the laptop case to the user's palm, causing discomfort and even pain. Indeed, in some laptops, the palm rest temperature has been measured to be higher than 40° C. Likewise, heat-generating components can cause the bottom of a laptop computer to become heated, causing discomfort or even pain to the user when the laptop is positioned in the user's lap. This has become a significant problem for makers of laptop computers, and other portable devices where there is a continuing effort to make the devices smaller for greater portability.

One potential solution is to insulate the heat source; however, this is not a satisfactory solution, since doing so keeps the heat generated by the heat source concentrated at the heat source, potentially damaging the heat source. Both performance reliability and life expectancy of electronic equipment are inversely related to the component temperature of the equipment. For instance, a reduction in the operating temperature of a device such as a typical silicon semiconductor can correspond to an increase in the processing speed, reliability and life expectancy of the device. Thus, concentrating heat generated at the heat source can be counterproductive.

One group of relatively light weight materials suitable for use in the dissipation of heat from heat sources such as electronic components are those materials generally known as graphites, but in particular graphites such as those based on natural graphites and flexible graphite as described below. These materials are anisotropic and allow thermal dissipation devices to be designed to preferentially transfer heat in selected directions. The graphite materials are much lighter in weight and thus provide many advantages over copper or aluminum.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity and fluid diffusion, comparable to the natural graphite starting material due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 $g/cm^3$ to about 2.0 $g/cm^3$. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increase orientation. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude, for the "c" and "a" directions.

While the use of sheets of compressed particles of exfoliated graphite (i.e., flexible graphite) has been suggested as thermal spreaders, thermal interfaces and as component parts of heat sinks for dissipating the heat generated by a heat source (see, for instance, U.S. Pat. Nos. 6,245,400; 6,482,520; 6,503,626; and 6,538,892), the issues of "touch temperature," that is the heating of external surfaces of a device to the extent that the user is discomfited or endangered has not adequately been addressed.

Accordingly, there is a continuing need for improved designs for thermal solutions for equipment containing heat-generating components, including portable or miniaturized devices, where the heat from the component needs to be dissipated while avoiding discomfiting or endangering users of the device.

SUMMARY OF THE INVENTION

The present invention provides a thermal solution capable of dissipating the heat from an electronic component, while simultaneously reducing the occurrence of hot spots, thus shielding a user from the effects of the heat generated by the component. The inventive thermal solution comprises an anisotropic sheet of compressed particle of exfoliated graphite (also referred to herein as "flexible graphite") integrated into the external surface of the equipment containing the heat-generating electronic component. As used herein, the term "flexible graphite" also refers to sheets of pyrolytic graphite, either singly or as a laminate.

The flexible graphite sheet employed in the thermal solution of the present invention has an in-plane thermal conductivity substantially higher than its through-plane thermal conductivity. In other words, the thermal solution of the present invention has a relatively high (on the order of 10 or greater) thermal anisotropic ratio. The thermal anisotropic ratio is the ratio of in-plane thermal conductivity to through-plane thermal conductivity.

The thermal solution comprises a sheet of flexible graphite having two major surfaces, interposed (or sandwiched) between two layers, which combine to form an integrated laminate or sandwich, which is used as one of the external surfaces of the equipment. The two layers sandwiching the thermal solution can be a plastic such as a high density polyethylene, a metal such as steel or aluminum, or a combination (such as metal as one of the layers of the laminate and plastic as the other), and form at least part of the case or shell of the equipment containing a heat-generating generating component. For instance, the layer/graphite sheet/layer sandwich can comprise a cell phone case; the bottom of a laptop computer case; part of a digital projector case; part of a vehicle dashboard, etc.

The two external layers can be mated in any suitable manner, such as through welding or soldering if metal, fusing together (in the case of plastic layers), or mechanical interlocking mechanisms, with the graphite sheet thermal solution disposed between the layers when joined. When acting as at least a portion of the external surface of the equipment housing a heat-generating component, such as a laptop, cell phone, PDA, etc., the thermal solution sandwich is thereby interposed between the heat-generating component and the equipment user and/or other devices or equipment located adjacent the equipment in which the inventive thermal solution is disposed.

Most preferably, the surface area of the flexible graphite sheet is greater than that of the area of the heat-generating component, such that the in-plane thermal conductivity of the flexible graphite sheet acts to dissipate heat from the component. In this way, the heat from the heat-generating component is spread across the surface area of the graphite sheet (and thus of the graphite-sheet containing laminate), reducing the occurrence of a hot spot caused by the heat-generating component on the surface of the equipment of which the heat-generating component is an element.

In addition, another benefit of the use of a flexible graphite material in the inventive laminate lies in the ability of graphitic materials to block electromagnetic and radio frequency (EMI/RF) interference. It is believed that the thermal solutions of this invention will function to shield components of the device of which it is a part from EMI/RF interference, in addition to performing the thermal dissipation function that is its primary purpose.

Accordingly, it is an object of the present invention to provide an improved thermal solution for dissipating the heat from a heat-generating component of a device.

Still another object of the present invention is the provision of a thermal solution having a sufficiently high thermal anisotropic ratio to function effectively for heat dissipation while minimizing hot spots.

Yet another object of the present invention is the provision of a heat spreader integrated into the external surface of equipment housing a heat-generating component.

These objects and others which will be apparent to the skilled artisan upon reading the following description, can be achieved by providing a thermal solution for equipment containing a heat-generating component, which includes a housing for equipment, such as an electronic device like a laptop, having a first component which forms a heat source, wherein the first component transmits heat to a surface of the housing, the housing comprising at least one sheet of flexible graphite sandwiched between two housing layers (i.e., functioning as at least a portion of the laptop case).

Preferably, the at least one sheet of flexible graphite has an in-plane thermal conductivity of at least about 140 W/m°0 K, more preferably at least about 250 W/m° K, and a through-plane thermal conductivity of no greater than about 12 W/m° K. The housing layers preferably comprise a plastic material, a metal material or combinations thereof.

More particularly, the thermal solution has two major surfaces and is positioned such that one of its major surfaces is in operative contact with the heat-generating component such that it is interposed between the component and the exterior of the electronic device. In some embodiments, a thermal transfer element, such as a gap filler, thermal interface or heat riser can be interposed between the thermal solution and the heat-generating component, while still remaining in operative contact.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operations of the invention.

DETAILED DESCRIPTION OF THE PREFERRED EMBODIMENTS

As noted, the inventive thermal solution has as an element thereof sheets of compressed particles of exfoliated graphite, commonly known as flexible graphite. Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions and the like. Natural graphite is most preferred.

The graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed.

Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like.

In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalated graphite flake with the organic reducing agent, the blend can be exposed to temperatures in the range of 25° to 125° C. to promote reaction of the reducing agent and intercalated graphite flake. The heating period is up to about 20 hours, with shorter heating periods, e.g., at least about 10 minutes, for higher temperatures in the above-noted range. Times of one-half hour or less, e.g., on the order of 10 to 25 minutes, can be employed at the higher temperatures.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive, as described in International Patent Application No. PCT/US02/39749.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station conventionally used for compressing (or "calendering") graphite worms into flexible graphite sheet. The resulting sheet therefore has higher area weight uniformity and greater tensile strength, even when the starting graphite particles are smaller than conventionally used. The lubricious additive is preferably a long chain hydrocarbon. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compression molded together into flexible sheets having small transverse openings that, unlike the original graphite flakes, can be formed and cut into various shapes, as hereinafter described.

Alternatively, the flexible graphite sheets of the present invention may utilize particles of reground flexible graphite sheets rather than freshly expanded worms. The sheets may be newly formed sheet material, recycled sheet material, scrap sheet material, or any other suitable source.

Also the processes of the present invention may use a blend of virgin materials and recycled materials.

The source material for recycled materials may be sheets or trimmed portions of sheets that have been compression molded as described above, or sheets that have been compressed with, for example, pre-calendering rolls. Furthermore, the source material may be sheets or trimmed portions of sheets that have been impregnated with resin, but not yet cured, or sheets or trimmed portions of sheets that have been impregnated with resin and cured. The source material may also be recycled flexible graphite PEM fuel cell components such as flow field plates or electrodes. Each of the various sources of graphite may be used as is or blended with natural graphite flakes.

Once the source material of flexible graphite sheets is available, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 mesh.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

If the source material has been resin impregnated, then preferably the resin is removed from the particles. Details of the resin removal are further described below.

Once the source material is comminuted, and any resin is removed, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinbefore described.

Flexible graphite sheet and foil are coherent, with good handling strength, and are suitably compressed by, e.g. compression molding, to a thickness of about 0.025 mm to 3.75 mm and a typical density of about 0.1 to 1.5 grams per cubic centimeter (g/cc). Although not always preferred, the flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. When used, a suitable resin content is preferably at least about 5% by weight, more preferably about 10 to 35% by weight, and suitably up to about 60% by weight. Resins found especially useful in the practice of the present invention include acrylic-, epoxy- and phenolic-based resin systems, or mixtures thereof. Suitable epoxy resin systems include those based on diglycidyl ether or bisphenol A (DGEBA) and other multifunctional resin systems; phenolic resins that can be employed include resole and novolak phenolics.

Figure 4:
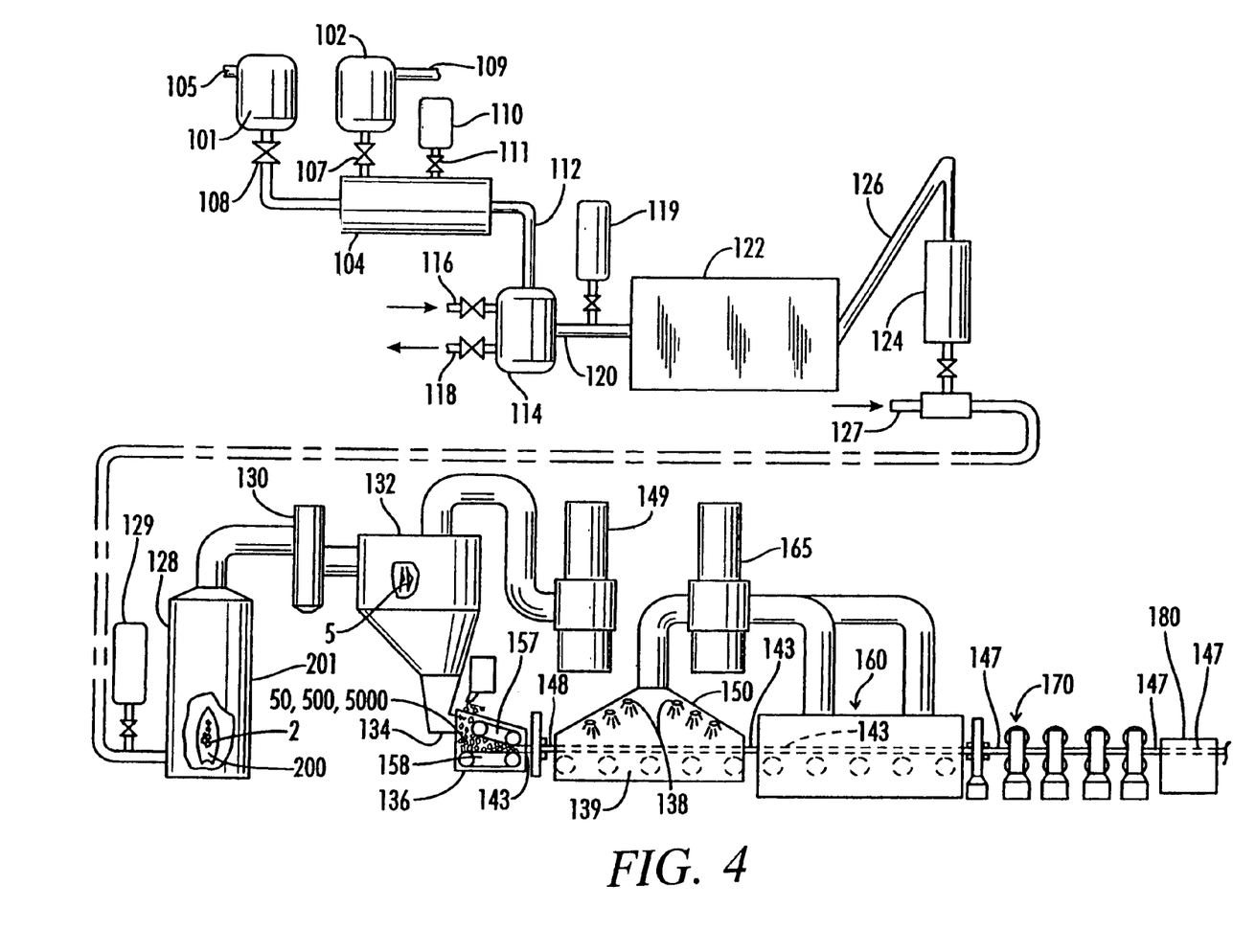
FIG. 4 illustrates a system for the continuous production of flexible graphite sheets.

With reference to FIG. 4, a system is disclosed for the continuous production of flexible graphite sheet, where graphite flakes and a liquid intercalating agent are charged into reactor 104. More particularly, a vessel 101 is provided for containing a liquid intercalating agent. Vessel 101, suitably made of stainless steel, can be continually replenished with liquid intercalant by way of conduit 106. Vessel 102 contains graphite flakes that, together with intercalating agents from vessel 101, are introduced into reactor 104. The respective rates of input into reactor 104 of intercalating agent and graphite flake are controlled, such as by valves 108, 107. Graphite flake in vessel 102 can be continually replenished by way of conduit 109. Additives, such as intercalation enhancers, e.g., trace acids, and organic chemicals may be added by way of dispenser 110 that is metered at its output by valve 111.

The resulting intercalated graphite particles are soggy and acid coated and are conducted (such as via conduit 112) to a wash tank 114 where the particles are washed, advantageously with water which enters and exits wash tank 114 at 116, 118. The washed intercalated graphite flakes are then passed to drying chamber 122 such as through conduit 120. Additives such as buffers, antioxidants, pollution reducing chemicals can be added from vessel 119 to the flow of intercalated graphite flake for the purpose of modifying the surface chemistry of the exfoliate during expansion and use and modifying the gaseous emissions which cause the expansion.

The intercalated graphite flake is dried in dryer 122, preferably at temperatures of about 75° C. to about 150° C., generally avoiding any intumescence or expansion of the intercalated graphite flakes. After drying, the intercalated graphite flakes are fed as a stream into flame 200, by, for instance, being continually fed to collecting vessel 124 by way of conduit 126 and then fed as a stream into flame 200 in expansion vessel 128 as indicated at 2. Additives such as ceramic fiber particles formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like can be added from vessel 129 to the stream of intercalated graphite particles propelled by entrainment in a non-reactive gas introduced at 127.

The intercalated graphite particles 2, upon passage through flame 200 in expansion chamber 201, expand more than 80 times in the "c" direction and assume a "worm-like" expanded form 5; the additives introduced from 129 and blended with the stream of intercalated graphite particles are essentially unaffected by passage through the flame 200. The expanded graphite particles 5 may pass through a gravity separator 130, in which heavy ash natural mineral particles are separated from the expanded graphite particles, and then into a wide topped hopper 132. Separator 130 can be by-passed when not needed.

The expanded, i.e., exfoliated graphite particles 5 fall freely in hopper 132 together with any additives, and are randomly dispersed and passed into compression station 136, such as through trough 134. Compression station 136 comprises opposed, converging, moving porous belts 157, 158 spaced apart to receive the exfoliated, expanded graphite particles 5. Due to the decreasing space between opposed moving belts 157, 158, the exfoliated expanded graphite particles are compressed into a mat of flexible graphite, indicated at 148 having thickness of, e.g., from about 25.4 to 0.075 mm, especially from about 25.4 to 2.5 mm, and a density of from about 0.08 to 2.0 g/cm$^3$. Gas scrubber 149 may be used to remove and clean gases emanating from the expansion chamber 201 and hopper 132.

The mat 148 is passed through vessel 150 and is impregnated with liquid resin from spray nozzles 138, the resin advantageously being "pulled through the mat" by means of vacuum chamber 139 and the resin is thereafter preferably dried in dryer 160 reducing the tack of the resin and the resin impregnated mat 143 is thereafter densified into roll pressed flexible graphite sheet 147 in calender mill 170. Gases and fumes from vessel 150 and dryer 160 are preferably collected and cleaned in scrubber 165.

After densification, the resin in flexible graphite sheet 147 is at least partially cured in curing oven 180. Alternatively, partial cure can be effected prior to densification, although post-densification cure is preferred.

If, however, the flexible graphite sheet is not resin-impregnated, case vessel, 150, dryer 160 and curing oven 180 can be eliminated.

Optionally, the flexible graphite sheet used to form the inventive thermal solution can be a laminate, with or without an adhesive between laminate layers. Non-graphite layers may be included in the laminate stack, although this is undesirable due to the additional thickness which would result. Such non-graphite layers may include metals, plastics or other non-metallics such as fiberglass or ceramics.

As noted above, the thusly-formed sheets of compressed particles of exfoliated graphite are anisotropic in nature; that is, the thermal conductivity of the sheets is greater in the in-plane, or "a" directions, as opposed to the through-sheet, or "c" direction. In this way, the anisotropic nature of the graphite sheet directs the heat along the planar direction of the thermal solution (i.e., in the "a" direction along the graphite sheet). Such a sheet generally has a thermal conductivity in the in-plane direction of at least about 140, more preferably at least about 200, and most preferably at least about 250 W/m° K and in the through-plane direction of no greater than about 12, more preferably no greater than about 10, and most preferably no greater than about 6 W/m° K. Thus, the thermal solution has a thermal anistropic ratio (that is, the ratio of in-plane thermal conductivity to through-plane thermal conductivity) of no less than about 10.

The values of thermal conductivity in the in-plane and through-plane directions of the laminate can be manipulated by altering the directional alignment of the graphene layers of the flexible graphite sheets used to form the thermal solution, including if being used to form a laminate, or by altering the directional alignment of the graphene layers of the laminate itself after it has been formed. In this way, the in-plane thermal conductivity of the thermal solution is increased, while the through-plane thermal conductivity of the thermal solution is decreased, this resulting in an increase of the thermal anisotropic ratio.

One of the ways this directional alignment of the graphene layers can be achieved is by the application of pressure to the component flexible graphite sheets, either by calendering the sheets (i.e., through the application of shear force) or by die pressing or reciprocal platen pressing (i.e., through the application of compaction), with calendering more effective at producing directional alignment.

Alternatively, if a laminate is formed, the directional alignment of the graphene layers which make up the laminate in gross is increased, such as by the application of pressure, resulting in a density greater than the starting density of the component flexible graphite sheets that make up the laminate. Indeed, a final density for the laminated article of at least about 1.4 g/cc, more preferably at least about 1.6 g/cc, and up to about 2.0 g/cc can be obtained in this manner. The pressure can be applied by conventional means, such as by die pressing or calendering. Pressures of at least about 60 megapascals (MPa) are preferred, with pressures of at least about 550 MPa, and more preferably at least about 700 MPa, needed to achieve densities as high as 2.0 g/cc.

Surprisingly, increasing the directional alignment of the graphene layers can increase the in-plane thermal conductivity of the graphite laminate to conductivities which are equal to or even greater than that of pure copper, while the density remains a fraction of that of pure copper. Additionally, the resulting aligned laminate also exhibits increased strength, as compared to a non-"aligned" laminate.

In another embodiment, increased in-plane thermal conductivity can be obtained by curing resin-impregnated flexible graphite sheets under pressure (whether as laminates or single sheets), as taught by Norley, Brady, Getz and Klug in International Patent Application No. PCT/US02/27633. More particularly, cure temperature should be sufficient to ensure that the lamellar structure to be densified at the curing pressure, while the thermal properties of the structure are not adversely impacted. Generally, this will require a temperature of at least about 90° C., and generally up to about 200° C. Most preferably, cure is at a temperature of from about 150° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to densify the structure to the required degree will be utilized. Such a pressure will generally be at least about 7 megapascals (Mpa, equivalent to about 1000 pounds per square inch), and need not be more than about 35 Mpa (equivalent to about 5000 psi), and more commonly from about 7 to about 21 Mpa (1000 to 3000 psi). The curing time may vary depending on the resin system and the temperature and pressure employed, but generally will range from about 0.5 hours to 2 hours. After curing is complete, the graphite material are seen to have a density of at least about 1.8 g/cm$^3$ and commonly from about 1.8 g/cm$^3$ to 2.0 g/cm$^3$.

Figure 1:
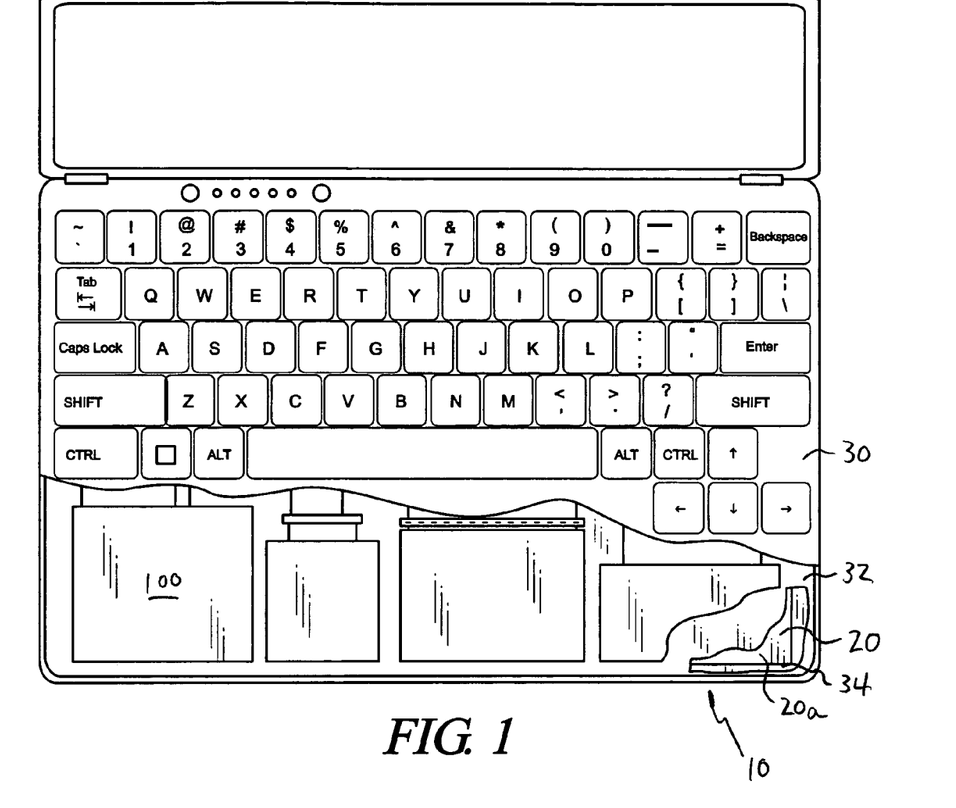
FIG. 1 is a partially broken-away top plan view of a first embodiment of the thermal solution of the present invention.
Figure 2:
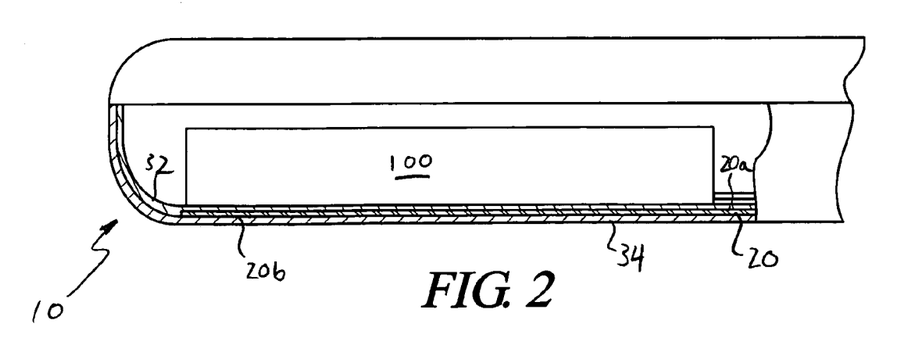
FIG. 2 is a bottom perspective view of a laptop computer having its bottom plate partially broken away.
Figure 3:
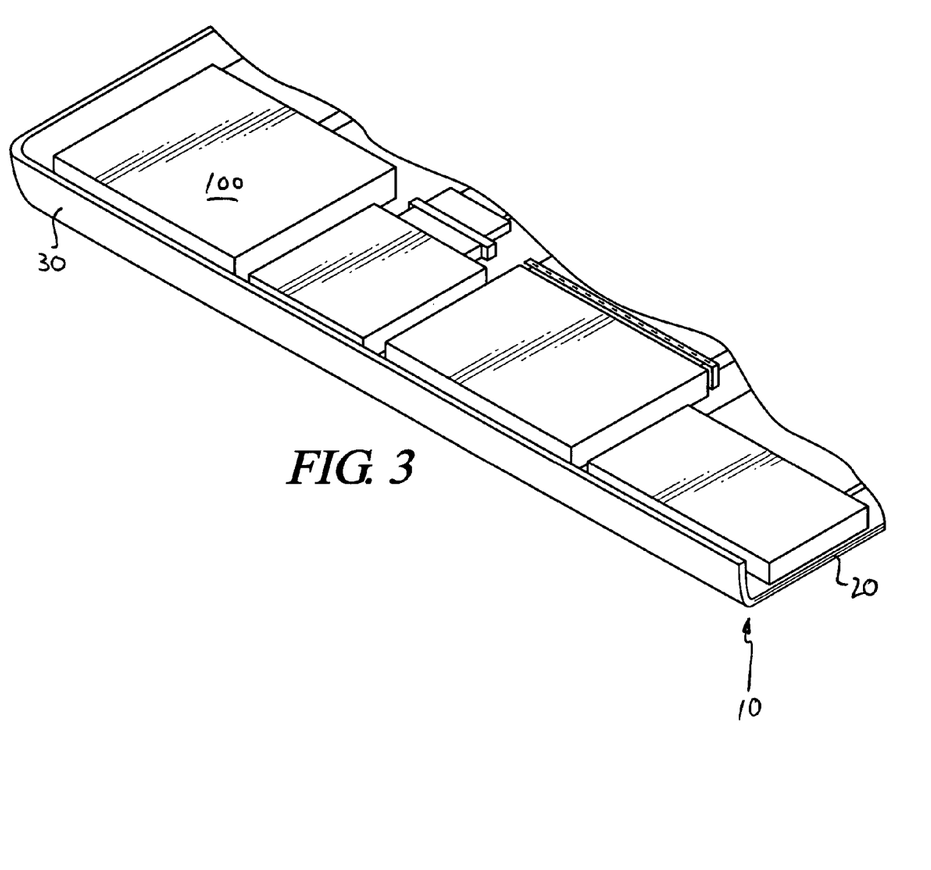
FIG. 3 a partially broken-away perspective view of the bottom of a laptop computer.

Referring now to the drawings, and particularly to FIGS. 1 and 2, an embodiment of the thermal solution of the present invention is shown and generally designated by the numeral 10. Thermal solution 10 comprises a sheet of compressed particles of exfoliated graphite 20, having two major surfaces, denoted 20a and 20b, embedded between two layers, 32 and 34, which together form the bottom of a laptop case 30. One of major surfaces 20a or 20b of flexible graphite sheet 20 is sized to be positioned in operative contact (through layer 32) with a heat source, denoted 100, such as an electronic component like a hard drive of a laptop computer or a chipset of a cellular phone, such that heat generated by heat source 100 dissipates into thermal solution 10. The area of the major surface 20a or 20b which is in operative contact with heat source 100 is greater than the area of operative contact with heat source 100, so that thermal solution 10 spreads the heat from heat source 100.

Because of the relatively high thermal anisotropic ratio of thermal solution 10, however, heat from heat source 100 is not effectively transmitted through the plane of thermal solution 10 from the one of major surfaces 20a or 20b of graphite sheet 20 in operative contact with heat source 100 to the other. Therefore, heat is not effectively transmitted as hot spots through layer 32 to the exterior of laptop 30 in which heat source 100 is located, but rather is dissipated, reducing the temperature of such external surface (by as much as 10° C. or more in some cases), when thermal solution 10 forms part of the case of laptop 30.

In addition, because graphite sheet 20 is sandwiched between layers 32 and 34, the possibility of graphite particles flaking from, or otherwise being separated from, thermal solution 10, no matter how remote, is forestalled. Likewise, flexible graphite sheet 20 is also advantageously effectively isolated from the components of laptop 30, to avoid electrical interference engendered by the inclusion of an electrically conductive material (graphite) in an electronic device.

As noted above, layers 32 and 34 can be formed of any material suitable for use as the case or external surface of the equipment in which thermal solution 10 is to be used. When the equipment is a laptop 30 or other electronic device, such as a cell phone, PDA, digital projector, etc., layers 32 and 34 can be formed of a plastic or metallic material, with or without suitable coatings as would be conventional.

Thermal solution 10 can be produced by several different processes. For instance, once flexible graphite sheet 20 is cut to size and shape to form thermal solution 10, it is interposed between layers 32 and 34, which are then joined together to form thermal solution 10. Layers 32 and 34 can be joined by any suitable mechanism, such as by being fused together (in the instance where layers 32 and 34 are formed of plastic); by soldering (in the instance where layers 32 and 34 are metallic) or by mechanical interlocking.

Thus, by use of the present invention, thermal shielding and thermal spreading of the heat generated by component of an electronic device is accomplished, in order to dissipate the heat as well as reduce the "touch temperature" of the device and the heat transmitted to adjacent components. These functions cannot be accomplished by more traditional heat dissipation materials like copper or aluminum which, because of their isotropic natures, would do little to reduce touch temperature or the heat transmitted to adjacent components. Insulating materials which could be used to reduce touch temperature and the heat transmitted to adjacent components would not dissipate heat and result in heat build-up about the heat source component.

All cited patents, patent applications and publications referred to in this application are incorporated by reference.

The invention thus being described, it will be obvious that it may be varied in many ways. Such variations are not to be regarded as a departure from the spirit and scope of the present invention and all such modifications as would be obvious to one skilled in the art are intended to be included within the scope of the following claims.

What is claimed is:

1. A thermal solution for equipment containing a heat-generating component, comprising:
  a housing for equipment comprising a first component which comprises a heat source, wherein the first component transmits heat to a surface of the housing in communication therewith, the housing comprising at least one sheet of compressed particles of exfoliated graphite with a density of at least 1.1 g/cm$^3$ sandwiched between two housing layers.

2. The solution of claim 1, wherein the at least one sheet of graphite has an in-plane thermal conductivity of at least about 140 W/m° K.

3. The solution of claim 2, wherein the at least one sheet of graphite has an in-plane thermal conductivity of at least about 250 W/m° K.

4. The solution of claim 2, wherein the at least one sheet of graphite has a through-plane thermal conductivity of no greater than about 12 W/m° K.

5. The solution of claim 1, wherein the housing layers comprise a plastic material, a metal material or combinations thereof.

6. The solution of claim 1, wherein the equipment is a laptop computer and the thermal solution comprises a portion of the laptop computer case.

7. The solution of claim 2, wherein the sheet of graphite is resin-impregnated.

8. A thermal dissipation and shielding system for an electronic device, comprising:
- an electronic device comprising a first component which comprises a heat source;
- a thermal solution comprising two major surfaces, the thermal solution positioned such that one of its major surfaces is in operative contact with the first component such that it is interposed between the first component and the exterior of the electronic device,
- wherein the thermal solution comprises at least one sheet of compressed particles of exfoliated graphite with a density of at least about 1.1 g/cm$^3$ sandwiched between two layers.

9. The system of claim 8, wherein the thermal solution comprises at least a portion of the housing of the electronic device.

10. The system of claim 9, wherein the at least one sheet of graphite has an in-plane thermal conductivity of at least about 140 W/m° K.

11. The system of claim 10, wherein the at least one sheet of graphite has an in-plane thermal conductivity of at least about 250 W/m° K.

12. The system of claim 10, wherein the at least one sheet of graphite has a through-plane thermal conductivity of no greater than about 12 W/m° K.

13. The system of claim 8, wherein the electronic device is a laptop computer, the first component comprises the hard drive of the laptop computer and the thermal solution comprises a portion of the laptop housing.

* * * * *